United States Patent [19]

Tanaka et al.

[11] 4,087,366

[45] May 2, 1978

[54] METHOD OF PREPARING A PIEZOELECTRIC CERAMIC COMPOSITION

[75] Inventors: Yoichi Tanaka, Funabashi; Masamichi Tsuruta; Koji Takahashi, both of Chiba; Tsutomu Hasegawa, Tokyo; Makoto Hori, Ichihara, all of Japan

[73] Assignee: TDK Electronic Company, Tokyo, Japan

[21] Appl. No.: 420,653

[22] Filed: Nov. 30, 1973

[51] Int. Cl.² ............... C04B 35/46; C04B 35/48; C04B 35/64
[52] U.S. Cl. .................................. 252/62.9
[58] Field of Search ....................... 252/62.9

[56] References Cited

U.S. PATENT DOCUMENTS

| 3,194,765 | 7/1965 | Bratschun | 252/62.9 |
|---|---|---|---|
| 3,344,073 | 9/1967 | Bratschun | 252/62.9 |
| 3,518,199 | 6/1970 | Tsubouchi et al. | 252/62.9 |
| 3,649,540 | 3/1972 | Nishida et al. | 252/62.9 |
| 3,661,781 | 5/1972 | Ichinose et al. | 252/62.9 |
| 3,669,887 | 6/1972 | Nishida et al. | 252/62.9 |
| 3,671,765 | 6/1972 | Hardtl | 252/62.9 |

FOREIGN PATENT DOCUMENTS

| 2,001,290 | 8/1971 | Germany | 252/62.9 |
|---|---|---|---|
| 1,052,870 | 12/1966 | United Kingdom | 252/62.9 |

OTHER PUBLICATIONS

Venevtsev et al., "Journal of Physical Society of Japan", vol. 28, pp. 139–144.
Moisan et al., "Chem. Abstracts", p. 9125f, vol. 74, 1971.
Kemmler et al. "Chem. Abstracts", P. 1507d, vol. 65, 1966.

*Primary Examiner*—Jack Cooper
*Attorney, Agent, or Firm*—Oblon, Fisher, Spivak, McClelland & Maier

[57] ABSTRACT

A piezoelectric ceramic composition which comprises the combination of a pyrochlore composite oxide and a base ceramic mixture of $PbTiO_3$ and $PbZrO_3$ is prepared by individually forming pyrochlore composite oxide, $PbTiO_3$ and $PbZrO_3$ components; and sintering a mixture of the formed components at a temperature greater than 1,000° C.

2 Claims, 5 Drawing Figures

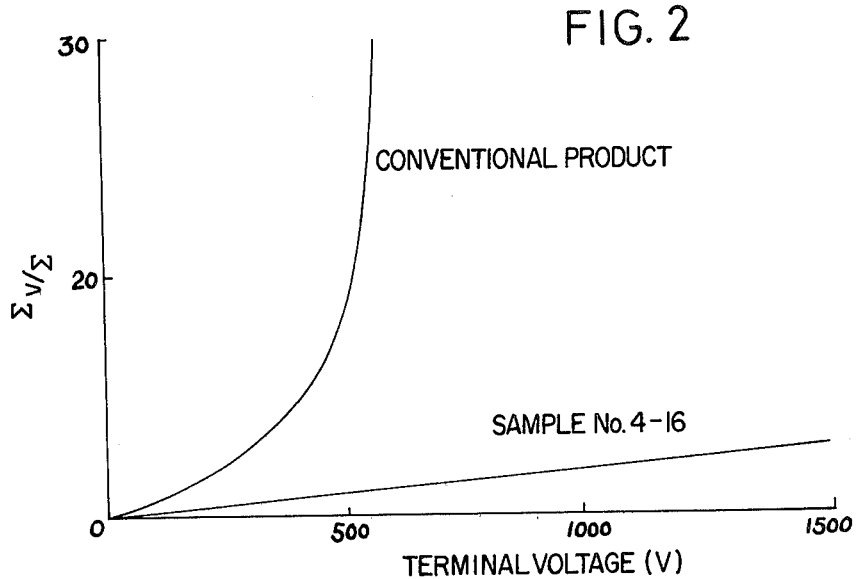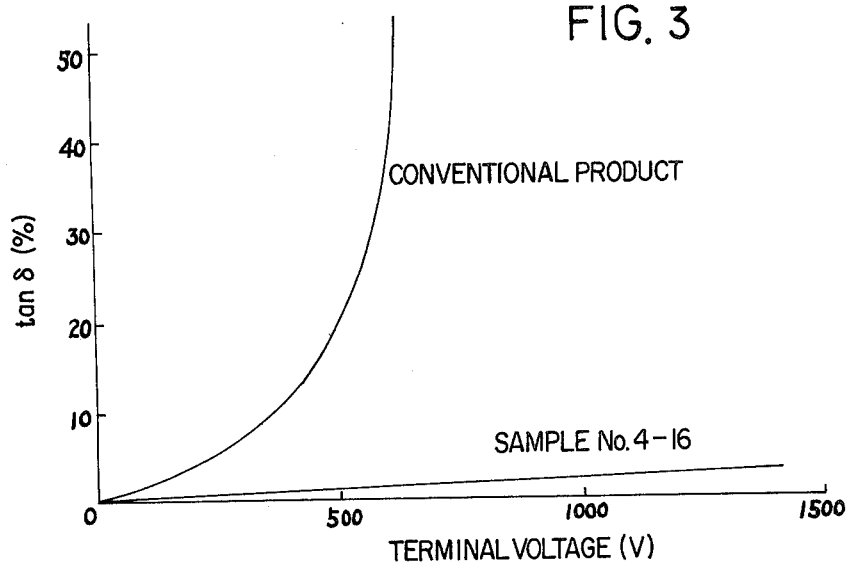

METHOD OF PREPARING A PIEZOELECTRIC CERAMIC COMPOSITION

BACKGROUND OF THE INVENTION

1. Field of the Invention

This invention relates to a piezoelectric ceramic composition. More particularly, it relates to a piezoelectric ceramic composition which has improved dielectric and piezoelectric characteristics.

2. Description of the Prior Art

Barium titanate type ceramic compositions and lead zirconatetitanate type ceramic compositions have been used as piezoelectric ceramic compositions. These compositions, however, are not stable industrial compositions. Therefore, efforts have been directed to developing improved piezoelectric compositions. One of these improved compositions is a ternary system of a solid solution of $Pb(Mg_{1/3}.NbHd\ 2/3)O_3$—$PbTiO_3$—$PbZrO_3$. It has also been proposed to modify and improve the piezoelectric properties of the composition by the addition of an oxide of Mn, Cr, Co, Fe or Ni to the basic composition. One of the problems with this composition is the moisture absorbing property of the composition containing Mg which interfers with accurate weighing of the composition and the storage of the starting materials. Although the composition has an electro-mechanical coupling coefficient, Kp of 50–58%, the dielectric loss of the composition is as high as 2–2.4%.

In the ternary solid solution of the base ceramic components of $PbTiO_3$—$PbZrO_3$ and the additive, $Pb(Mn_{1/3}Sb_{2/3})O_3$, the dielectric constant $\epsilon$ and the electro-mechanical coupling coefficient Kp are easily changed by small changes in the components. Compositions having Kp values greater than 50% have low dielectric constants of about 500. Since compositions having a dielectric constant greater than 1000 have been limited to rather narrow ranges of the components, the number of industrially suitable piezoelectric has been limited to a relative few. The compositions of the prior art have been combinations of the above base ceramics components and a perovskite type component, $ABO_3$.

Other proposed improvements for the compositions have involved the addition of certain additives to the base ceramic components of $PbTiO_3$—$PbZrO_3$. For example, in one procedure, the basic ceramic composition has been modified by substituting Pb by Sr and by the addition of a component of $Sb_2O_3$ and $MnO_2$. Up to the present, the most effective modified piezoelectric composition has been one whose base ceramic components of $PbTiO_3$ and $PbZrO_3$ are in a ratio of 47:53 and which has had values of Kp = 60%, $\epsilon$ = 1750 and tan $\delta$ = 2.5%. However, these compositions have had the disadvantage that their performance characteristics are readily changed by the small changes in their component structure. For example, a change in the quantity of Mn of 0.15 wt.% causes a change of Qm from about 1170 to about 300. If it is desired to decrease the tan $\delta$ value to 1.0% by adding another component, the value of Kp changes from 60% to 48.3%. To the present, piezoelectric ceramic compositions having the desired combination of Kp, $\epsilon$, Q and tan $\delta$ values which are stable to small changes in the component makeup of the composition have not been obtained.

A need therefore, continues to exist for piezoelectric compositions which have Kp, $\epsilon$, Q and tan $\delta$ values which are stable to small changes in the component makeup of the compositions, and which have high piezoelectric constants.

SUMMARY OF THE INVENTION

Accordingly, one object of the invention is to provide a piezoelectric ceramic composition having a high piezoelectric constant and stability which has an optimum balance of the electro-mechanical coupling coefficient Kp, the dielectric constant $\epsilon$, the mechanical quality factor Qm and the low dielectric loss factor tan $\delta$.

Another object of the invention is to provide a piezoelectric ceramic composition having a high stability to applied voltages and high flex strength which has improved dielectric and piezoelectric characteristics.

Yet another object of the invention is to provide a piezoelectric ceramic composition which is useful as a high power ultrasonic transducer in water or as a wide band filter element.

Briefly, these objects and other objects of the invention as hereinafter will become more readily apparent can be attained by providing a piezoelectric ceramic composition which comprises the combination of a pyrochlore complex oxide $A_2B_2O_7$ and a mixture of $PbTiO_3$—$PbZrO_3$ ceramic components.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 is a graph showing the relationship of $\epsilon_{v/\epsilon}$ to a measured terminal voltage;

FIG. 3 is a graph showing the relationship of tan $\delta$ to a measured terminal voltage;

DETAILED DESCRIPTION OF THE PREFERRED EMBODIMENT

The piezoelectric ceramic, solid solution composition of the invention has the following characteristics: Kp of 50% to 76%, $\epsilon$ of 1000 to 2500 and a tan $\delta$ value of less than 2.0%.

Figure 1:
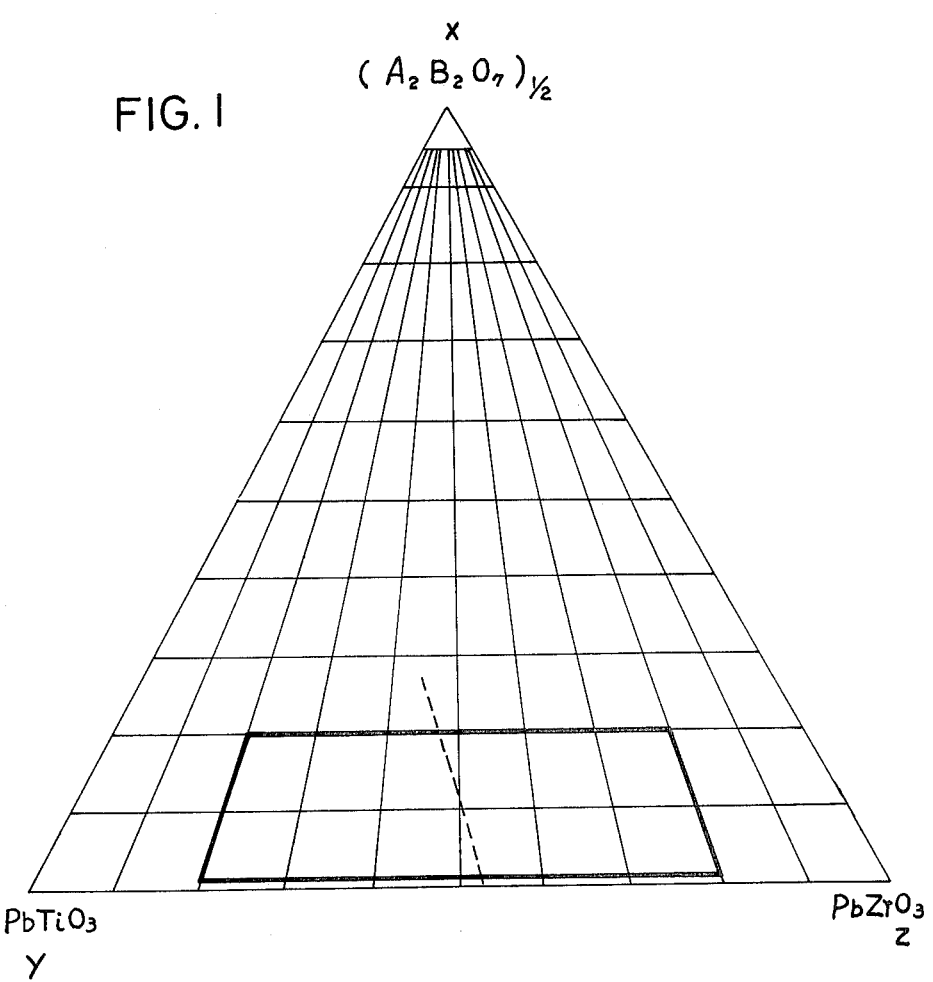
FIG. 1 is a triangular coordinate of the ternary system solid solution of the invention.

Pyrochlore type composite oxides which the present composition contains have complicated structures having 8 structural units per unit cell. In addition, the $NbO_6$ component of the pyrochlore oxide has zig-zag chains of O—Nb—O and one oxygen atom which is bonded by four cadmium atoms. The latter group is independent of the Nb atom. When the pyrochlore type composite oxide of $Cd_2Sb_2O_7$ or $Cd_2Nb_2O_7$ or a composite oxide formed by substituting Pb, Sr or Ba for Cd is combined with the base ceramic components of $PbTiO_3$ and $PbZrO_3$ and the mixture is sintered at a temperature greater than 1000° C, a piezoelectric ceramic composition having the following formula is formed: $(1-x)[yPbTiO_3 . zPbZrO_3] . x$(pyrochlore complex oxide — $A_2B_2O_7)_{1/2}$, wherein $0.2 \leq y \leq 0.8$, $0.2 \leq z \leq 0.8$, $y + z = 1.0$ and $0.001 \leq x \leq 0.2$. The mixture of pyrochlore composite oxide and ceramic components can be calcined before it is sintered. Preferably, Mn is added to the composition as $MnO_2$ in quantities of 0.01–3.0 wt.% relative to the total basic components. FIG. 1 is a triangular coordinate system of the ternary solid solution $[x(A_2B_2O_7)_{1/2} \cdot yPbTiO_3 \cdot zPbZrO_3]$ of the invention.

When a pyrochlore type composite oxide of $(Cd_2Sb_2O_7)_{1/2}$, $(Cd_2Nb_2O_7)_{1/2}$ or the oxide in which Pb, Sr or Ba is substituted for Cd, is combined with $Pb(Ti \cdot Zr)O_3$ in amounts of 1–20 mole %, a piezoelectric composition is obtained whose characteristics change continuously with corresponding degrees of change of the amounts of the components of the composition, that is, the characteristics of the composition do not suddenly and appreciably change upon minor changes of the constituents in the composition. Because of this, the composition is useful industrially.

The compositions of the invention which are suitable for broad applications and practical uses, have ratios of $PbTiO_3$ to $PbZrO_3$ of 46 - 54 : 54 - 46 mole % and $Pb(Ti \cdot Zr)O_3$ to $(A_2B_2O_7)_{1/2}$ ratios of 100 - 1~20 : 1 - 20 mole % wherein A is Cd, Pb, Sr, or Ba and B is Sb or Nb. Suitable pyrochlore oxides $A_2B_2O_7$ include $Cd_2Sb_2O_7$, $Cd_2Nb_2O_7$, $Pb_2Sb_2O_7$, $Pb_2Nb_2O_7$, $Sr_2Sb_2O_7$, $Sr_2Nb_2O_7$, $Ba_2Sb_2O_7$, and $Ba_2Nb_2O_7$.

The compositions have Kp values greater than about 60%, $\epsilon$ values greater than about 1400 and tan $\delta$ of less than 2%. The piezoelectric properties of the compositions are continuous in the range of 1–20 mole % of $(A_2B_2O_7)_{1/2}$, so that the stability of the composition is remarkably high, as shown in Tables 1 and 5.

The pyrochlore composite oxides of $(A_2B_2O_7)_{1/2}$ wherein A is Pb, Sr or Ba and B is Sb or Nb, is combined with $Pb(Ti \cdot Zr)O_3$, and characteristics similar to these for the pyrochlore oxides above shown in Table 2 are obtained.

When Mn is present in the composition, the mechanical quality factor Qm can be increased to about 2000 to 4500 and the dielectric loss tan$\delta$ is decreased to less than 1%. However, the dielectric constant and the electromechanical coupling coefficient do not fluctuate much, so that a remarkable combination of characteristics of Kp, $\epsilon$, tan $\delta$ and Qm can be obtained. Thus, the composition can be readily mass produced. The effects imparted by Mn for improving the mechanical quality factor of the compositions are also attained with the other pyrochlore complex oxides and $Pb(Ti \cdot Zr)O_3$ whereby the electromechanical coupling coefficient Kp can be greater than 72%, i.e., about 78%, the dielectric constant and the mechanical quality factor are maintained as suitable values and the dielectric loss tan $\delta$ can be reduced to values less than 1%, i.e., about 0.2%.

The improved characteristics exhibited by the compositions of the invention fluctuate only very slowly when the amounts of the components are altered because the complex pyrochlore oxides have long-range forces which are characteristic of the pyrochlore oxides. They are very different from the $ABO_3$ type compounds.

The ferroelectric piezoelectric ceramic compositions of the invention have the characteristics of being continuously stable while showing only slight fluctuations of the characteristics when the components of the compositions are changed only slightly. Thus, the industrial advantages for these compositions are substantial.

The combined characteristics of the compositions of the invention are very good, and as a result, the dielectric characteristics exhibit a high degree of stability to changes of the applied voltage as shown in FIGS. 2 and 3. In comparison to the low stability of the conventional compositions, the solid solutions containing the pyrochlore complex oxides of the invention have remarkable stability.

As shown in FIG. 2, the stability of the dielectric constant of the composition of the invention to a change in voltage is very substantial and the temperature coefficient of the dielectric constant is much superior as shown in the tables which follow later.

When the piezoelectric ceramic composition is used as an ultrasonic transducer, the input load increases in the generation of high ultrasonic waves. The stability of the dielectric loss (tan $\delta$)-voltage characteristics is important in this regard.

An increase in the tan $\delta$ value means an increase in the amount of heat which is not desirable. FIG. 3 shows the excellent characteristics of the piezoelectric ceramic composition of the invention. The mechanical quality factor Qm which is in a reciprocal relationship to tan $\delta$, is also very stable to changes in the voltage.

Figure 4:
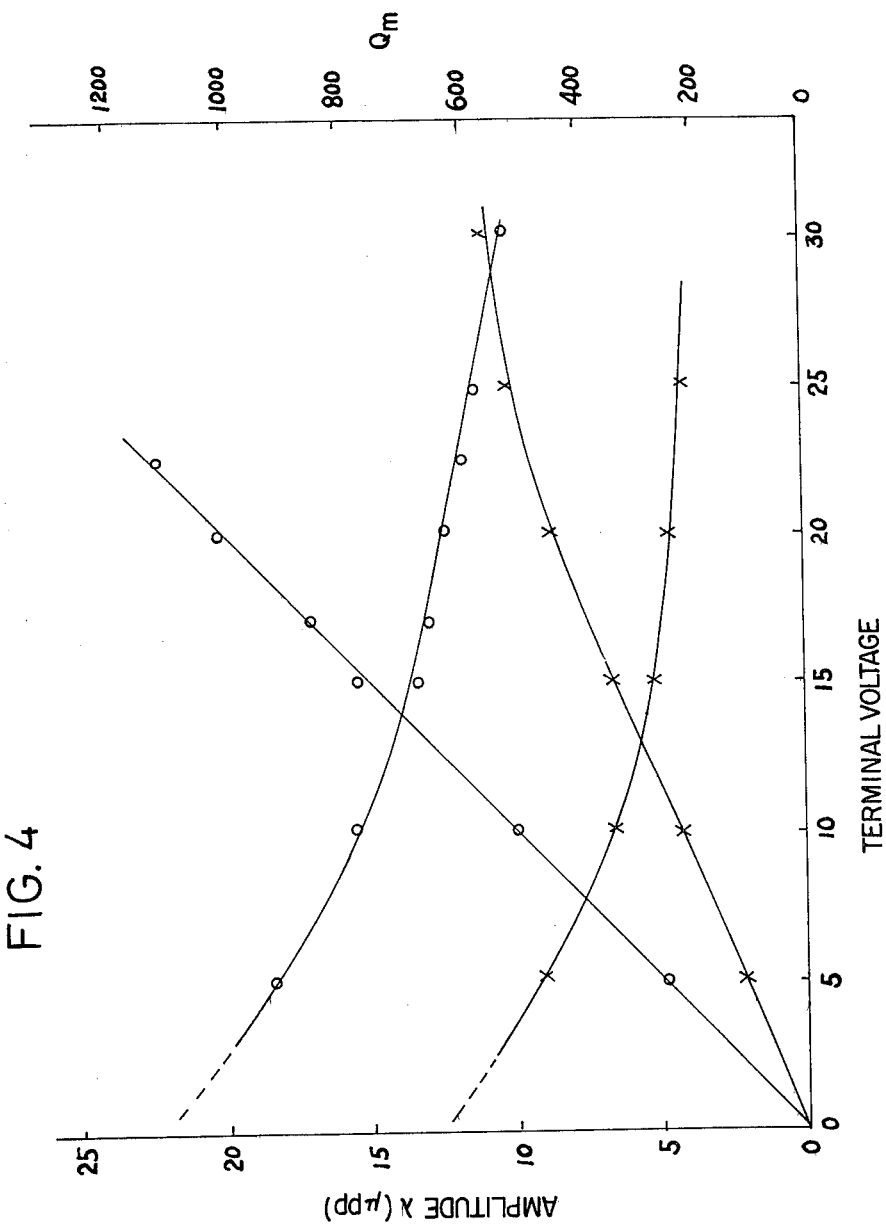
FIG. 4 is a graph showing the relationship of amplitude to a terminal voltage.

FIG. 4 shows the relationship of the mechanical quality factor Q of a bolt fitted Langevin transducer (30 mm diameter) and the amplitude $\lambda$ under non-loaded conditions in air, which shows excellent overall piezoelectric characteristics with excellent dielectric characteristics.

When a conventional transducer is resonated in a range of 0–30 volts, the transducer shows a sudden decrease in the mechanical quality factor Q at about 10 volts, and the amplitude is limited to 3–4 $\mu$. However, transducers made of the composition of the invention show a high stability for the mechanical quality Q factor as shown in FIG. 4. With these transducers it is possible to transduce forcibly at a level of 50 volts to generate high intensity ultrasonic power. Also, the transducer does not deteriorate with increasing applied voltages. Since the solid solutions of the invention contain the pyrochlore complex oxides, they exhibit stability to applied voltages which is a fundamental characteristic of the pyrochlore oxides. If the solid solutions contain from 0.1–20 moles of pyrochlore complex oxides, they exhibit the desired fundamental characteristics of the pyrochlore oxide.

When the temperature coefficient of the dielectric constant $\epsilon$-T.C. is high and the piezoelectric ceramic composition itself is heated, changes in the dielectric constant $\epsilon$ increase while the impedance changes which means that the impedance matching deteriorates and, accordingly, the maximum amplitude cannot be attained. However, the piezoelectric ceramic compositions of the invention have excellent temperature efficiency.

The piezoelectric ceramic compositions of the invention have suitable piezoelectric characteristics as ultrasonic transducers. The composition of the invention can also be effectively used in various elements such as ceramic filters, accelerameters, pick-ups and the like, without limiting the effectiveness of the ultrasonic transducer as the three components of the composition are varied or as the amount of manganese additive is varied.

Having generally described this invention, a further understanding can be obtained by reference to certain specific examples which are provided herein for purposes of illustration only and are not intended to be limiting unless otherwise specified.

EXAMPLE 1

PbO, $TiO_2$, $ZrO_2$, CdO and $Sb_2O_5$ were used as the starting powdery materials for the preparation of a piezoelectric ceramic composition. ($Sb_2O_3$ can be used instead of $Sb_2O_5$ in equimolar amounts.) The starting powdery materials were weighed and mixed to provide the $Cd_2Sb_2O_7$, $PbTiO_3$, and $PbZrO_3$ components. The mixed starting powdery materials were mixed well in a separate ball mill and the mixture was molded and calcined at 900° C. The resulting $Cd_2Sb_2O_7$, $PbTiO_3$ and $PbZrO_3$ components were weighed and mixed to provide compositions with the atomic ratio of $x$, $y$, $z$ shown in Table 1. The mixture was further crushed, mixed by a ball mill and was molded under pressure of 1.5 ton/$cm^2$ to form a 20 mm diameter disc with a thickness of 1 mm. The disc was sintered at 1200°–1250° C for 2 hours to prepare a ferroelectric piezoelectric ceramic composition. The composition was then used as a piezoelectric element in the conventional manner. A pair of Ag electrodes was placed on both sides of the disc of the piezoelectric element and then the disc was dipped into silicon oil at 100°–150° C. A DC voltage of 3 KV/mm was impressed across the electrodes for 1 hour to polarize them. The disc was operated for 24 hours, and in order to evaluate the piezoelectric properties, i.e., the electromechanical coupling coefficient (Kp) and the mechanical quality factor (Qm), the I.R.E. standard circuit method was used. The coefficient Kp was calculated by the resonant frequency ($fr$) and the antiresonant frequency ($fa$). The dielectric constant ($\epsilon$) and the dielectric loss (tan$\delta$) were made under a frequency of 1 KHz. The value of $\epsilon$-T.C. was measured as a temperature coefficient of $\epsilon$.

The piezoelectric properties of various $(1-x)Pb(Ti_y.Zr_z)O_3 \cdot x(Cd_2Sb_2O_7)_{1/2}$ compositions are shown in Table 1, wherein the amounts of the components and the resulting compositions are shown by $x$, $1-x$, $y$ and $z$. [$x(Cd_2Sb_2O_7)_{1/2}$ and $(1-x)(yPbTiO_3-zPbZrO_3)$ were combined to form a solid solution.] As is clear from Table 1, high electromechanical coupling coefficients Kp were obtained over a relatively broad range, and the optimum values of Qm, $\epsilon/\epsilon_o$ and tan $\delta$ which are necessary for the intended purposes of the composition vary according to the broad range compositions selected. Sample numbers 1-26, 1-27 and 1-28 are conventional $PbTiO_3$–$PbZrO_3$ piezoelectric ceramic compositions. The results of the tests show that the compositions of the invention have substantially superior properties over those of the conventional compositions.

Table 1

| | $x(Cd_2Sb_2O_7)_{\frac{1}{2}} \cdot (1-x)[y(PbTiO_3) \cdot z PbZrO_3)]$ | | | | | | | | |
|---|---|---|---|---|---|---|---|---|---|
| No. | x | 1−x | y | z | $\epsilon/\epsilon$ | tan$\Delta$ (%) | Kp (%) | Qm | fr T.C. (ppm/C) |
| 1-1 | 0.20 | 0.80 | 0.80 | 0.20 | 336 | 1.9 | 18.2 | 210 | 1800 |
| 1-2 | 0.20 | 0.80 | 0.70 | 0.30 | 440 | 2.0 | 22.2 | 140 | 1620 |
| 1-3 | 0.20 | 0.80 | 0.48 | 0.52 | 2590 | 2.2 | 32.1 | 50 | 900 |
| 1-4 | 0.20 | 0.80 | 0.30 | 0.70 | 470 | 1.8 | 21.2 | 110 | 1590 |
| 1-5 | 0.20 | 0.80 | 0.20 | 0.80 | 375 | 1.7 | 17.6 | 140 | 1800 |
| 1-6 | 0.10 | 0.90 | 0.54 | 0.46 | 1330 | 1.9 | 584 | 80 | 1090 |
| 1-7 | 0.10 | 0.90 | 0.48 | 0.52 | 2490 | 1.8 | 67.1 | 60 | 870 |
| 1-8 | 0.10 | 0.90 | 0.46 | 0.54 | 1480 | 1.8 | 58.2 | 75 | 860 |
| 1-9 | 0.08 | 0.92 | 0.56 | 0.50 | 2540 | 2.0 | 69.5 | 50 | 1130 |
| 1-10 | 0.08 | 0.92 | 0.48 | 0.52 | 2510 | 1.9 | 67.5 | 50 | 830 |
| 1-11 | 0.05 | 0.95 | 0.80 | 0.20 | 430 | 1.3 | 20.6 | 145 | 1920 |
| 1-12 | 0.05 | 0.95 | 0.68 | 0.32 | 480 | 1.5 | 24.5 | 130 | 1680 |
| 1-13 | 0.05 | 0.95 | 0.60 | 0.40 | 850 | 1.4 | 35.1 | 95 | 1030 |
| 1-14 | 0.05 | 0.95 | 0.52 | 0.48 | 1800 | 1.5 | 55.5 | 75 | 950 |
| 1-15 | 0.05 | 0.95 | 0.50 | 0.50 | 2350 | 1.7 | 67.2 | 65 | 870 |
| 1-16 | 0.05 | 0.95 | 0.49 | 0.51 | 2490 | 1.9 | 74.1 | 60 | 850 |
| 1-17 | 0.05 | 0.95 | 0.48 | 0.52 | 2390 | 2.0 | 76.0 | 55 | 820 |
| 1-18 | 0.05 | 0.95 | 0.46 | 0.54 | 1400 | 2.1 | 69.3 | 75 | 870 |
| 1-19 | 0.05 | 0.95 | 0.40 | 0.60 | 850 | 2.1 | 44.4 | 80 | 1230 |
| 1-20 | 0.05 | 0.95 | 0.32 | 0.68 | 550 | 1.8 | 31.7 | 240 | 1840 |
| 1-21 | 0.01 | 0.99 | 0.80 | 0.20 | 305 | 1.4 | 19.2 | 190 | 1890 |
| 1-22 | 0.01 | 0.99 | 0.70 | 0.30 | 385 | 1.4 | 23.5 | 145 | 1680 |
| 1-23 | 0.01 | 0.99 | 0.48 | 0.52 | 1550 | 1.5 | 72.1 | 60 | 820 |
| 1-24 | 0.01 | 0.99 | 0.30 | 0.70 | 430 | 1.8 | 27.8 | 250 | 1640 |
| 1-25 | 0.01 | 0.99 | 0.20 | 0.80 | 296 | 2.0 | 21.1 | 300 | 1620 |
| 1-26 | 0 | 1.00 | 0.20 | 0.45 | 340 | — | 8.0 | 46 | — |
| 1-27 | 0 | 1.00 | 0.48 | 0.52 | 1060 | — | 44.0 | 240 | — |
| 1-28 | 0 | 1.00 | 0.30 | 0.70 | 370 | — | 27.0 | 370 | — |

NOTE: $x \pm (1-x) = 1$ and $y+z=1$

EXAMPLE 2

In accordance with the preparation of Example 1, $Sr_2Sb_2O_7$, $Pb_2Sb_2O_7$ or $Ba_2Sb_2O_7$ was substituted for $Cd_2Sb_2O_7$. The piezoelectric properties of the resulting compositions are shown in Table 2, together with the components and the compositions. When Cd was substituted by Sr, Ba or Pb, ternary system solid solution ceramics similar to those of Example 1 were obtained. The compositions have high $\epsilon/\epsilon_o$ values which results in high piezoelectric $d$ constants. Kp and $\epsilon$ values, which are bases of the piezoelectric $d$ constant are shown in Table 2.

TABLE 2

| | | $x(A_2Sb_2O_7)_{\frac{1}{2}} \cdot (1-x)[y(PbTiO_3) \cdot z(PbZrO_3)]$ | | | | | | | |
|---|---|---|---|---|---|---|---|---|---|
| No. | A | x | 1−x | y | z | $\epsilon/\epsilon_o$ | tan$\Delta$ (%) | Kp (%) | Qm | fr-T.C. (ppm/C) |
| 2-1 | Sr | 0.20 | 0.80 | 0.80 | 0.20 | 550 | 1.8 | 21.2 | 200 | 1780 |
| 2-2 | Sr | 0.20 | 0.80 | 0.50 | 0.50 | 3200 | 2.0 | 35.1 | 140 | 980 |
| 2-3 | Sr | 0.10 | 0.90 | 0.54 | 0.46 | 1530 | 1.8 | 59.8 | 80 | 1120 |
| 2-4 | Sr | 0.10 | 0.90 | 0.46 | 0.54 | 2990 | 1.7 | 60.2 | 70 | 930 |
| 2-5 | Sr | 0.05 | 0.95 | 0.60 | 0.40 | 890 | 1.3 | 36.0 | 100 | 1020 |
| 2-6 | Sr | 0.05 | 0.95 | 0.52 | 0.48 | 1800 | 1.4 | 58.0 | 75 | 970 |
| 2-7 | Sr | 0.05 | 0.95 | 0.40 | 0.60 | 850 | 1.9 | 44.5 | 80 | 1000 |
| 2-8 | Sr | 0.01 | 0.99 | 0.52 | 0.48 | 1300 | 1.3 | 69.2 | 65 | 1030 |
| 2-9 | Sr | 0.01 | 0.99 | 0.48 | 0.52 | 1550 | 1.5 | 73.0 | 70 | 880 |
| 2-10 | Pb | 0.20 | 0.80 | 0.70 | 0.30 | 520 | 1.9 | 20.5 | 180 | 1730 |
| 2-11 | Pb | 0.20 | 0.80 | 0.48 | 0.52 | 3050 | 2.2 | 36.0 | 130 | 990 |
| 2-12 | Pb | 0.10 | 0.90 | 0.54 | 0.46 | 1490 | 1.8 | 58.3 | 80 | 1030 |
| 2-13 | Pb | 0.10 | 0.90 | 0.46 | 0.54 | 2950 | 1.7 | 60.5 | 75 | 930 |
| 2-14 | Pb | 0.05 | 0.95 | 0.60 | 0.40 | 800 | 1.3 | 35.5 | 95 | 1010 |
| 2-15 | Pb | 0.05 | 0.95 | 0.52 | 0.48 | 1780 | 1.4 | 57.0 | 70 | 930 |
| 2-16 | Pb | 0.05 | 0.95 | 0.40 | 0.60 | 830 | 1.8 | 43.5 | 85 | 1280 |
| 2-17 | Pb | 0.01 | 0.99 | 0.52 | 0.48 | 1310 | 1.5 | 69.0 | 65 | 970 |
| 2-18 | Pb | 0.01 | 0.99 | 0.48 | 0.52 | 1530 | 1.6 | 72.5 | 70 | 910 |
| 2-19 | Ba | 0.20 | 0.80 | 0.80 | 0.20 | 590 | 2.0 | 22.0 | 210 | 1780 |
| 2-20 | Ba | 0.20 | 0.80 | 0.50 | 0.50 | 3320 | 2.3 | 36.5 | 130 | 970 |
| 2-21 | Ba | 0.10 | 0.90 | 0.54 | 0.46 | 1580 | 1.9 | 58.9 | 82 | 1090 |
| 2-22 | Ba | 0.10 | 0.90 | 0.46 | 0.54 | 3050 | 2.1 | 61.2 | 70 | 960 |
| 2-23 | Ba | 0.05 | 0.95 | 0.60 | 0.40 | 900 | 1.5 | 36.5 | 100 | 1070 |
| 2-24 | Ba | 0.05 | 0.95 | 0.52 | 0.44 | 1890 | 1.9 | 60.2 | 70 | 990 |
| 2-25 | Ba | 0.05 | 0.95 | 0.40 | 0.60 | 920 | 2.2 | 45.5 | 80 | 1250 |
| 2-26 | Ba | 0.01 | 0.99 | 0.52 | 0.48 | 1360 | 1.5 | 68.7 | 75 | 990 |

TABLE 2-continued

| | | $x(A_2Sb_2O_7)_{\frac{1}{4}} \cdot (1-x)[y(PbTiO_3) \cdot z(PbZrO_3)]$ | | | | | | | |
|---|---|---|---|---|---|---|---|---|---|
| No. | A | x | 1−x | y | z | $\epsilon/\epsilon_o$ | tanΔ (%) | Kp (%) | Qm | fr-T.C. (ppm/C) |
| 2-27 | Ba | 0.01 | 0.99 | 0.78 | 0.52 | 1515 | 1.7 | 71.2 | 70 | 910 |

NOTE:
x + (1−x) = 1 and y + z = 1

EXAMPLE 3

The procedure for the preparations of Example 1 was followed except that $MnO_2$ was added to the basic components. The piezoelectric compositions were prepared and the piezoelectric properties were measured as shown in Table 3. The flex strength of the compositions is shown by the $Kg/cm^2$ unit, and the temperature coefficient of the dielectric constant $\epsilon$ is shown by the ppm/°C unit.

As is clear from Table 3, the values of Qm and tan δ were improved by the addition of $MnO_2$. However, when more than 3 wt.% $MnO_2$ was added, the values of Qm and $\epsilon/\epsilon_o$ decreased while the value of tan δ increased. Also, the compositions had inferior insulation properties. Accordingly, the optimum quantity of the manganese ($MnO_2$) component was established in the range of 0.01–3.0 wt.% based on the total weight of basic components.

Table 3

| | $x(Cd_2Sb_2O_7)_{\frac{1}{4}} \cdot (1-x)[y(PbTiO_3) \cdot z(PbZrO_3)]$ | | | | | | | | | |
|---|---|---|---|---|---|---|---|---|---|---|
| No. | x | 1 − x | y | z | $MnO_2$ (Wt%) | $\epsilon/\epsilon_o$ | tan δ (%) | Kp (%) | Qn | flex strength (Kg/cm²) | fr-T.C. (ppm/C) |
| 3-1 | 0.20 | 0.80 | 0.70 | 0.30 | 0 | 440 | 2.0 | 22.2 | 40 | 830 | 1620 |
| 3-2 | 0.20 | 0.80 | 0.70 | 0.30 | 0.01 | 432 | 1.2 | 22.1 | 1340 | 850 | 1600 |
| 3-3 | 0.20 | 0.80 | 0.70 | 0.30 | 0.05 | 430 | 0.9 | 22.0 | 2900 | 930 | 1570 |
| 3-4 | 0.20 | 0.80 | 0.70 | 0.30 | 0.1 | 415 | 0.6 | 22.0 | 3500 | 990 | 1530 |
| 3-5 | 0.20 | 0.80 | 0.70 | 0.30 | 0.3 | 407 | 0.3 | 21.7 | 4050 | 1090 | 1500 |
| 3-6 | 0.20 | 0.80 | 0.70 | 0.30 | 0.5 | 400 | 0.2 | 21.5 | 5500 | 1150 | 1480 |
| 3-7 | 0.20 | 0.80 | 0.70 | 0.30 | 1.0 | 395 | 0.03 | 20.6 | 3200 | 1210 | 1530 |
| 3-8 | 0.20 | 0.80 | 0.70 | 0.30 | 3.0 | 385 | 0.6 | 20.0 | 2350 | 1060 | 1540 |
| 3-9 | 0.20 | 0.80 | 0.70 | 0.30 | 4.0 | 325 | 1.6 | 16.2 | 480 | 980 | 1650 |
| 3-10 | 0.10 | 0.90 | 0.54 | 0.46 | 0 | 1330 | 1.9 | 58.4 | 80 | 860 | 1090 |
| 3-11 | 0.10 | 0.90 | 0.54 | 0.46 | 0.05 | 1150 | 0.7 | 558.0 | 1800 | 920 | 1110 |
| 3-12 | 0.10 | 0.90 | 0.54 | 0.46 | 0.1 | 1110 | 0.3 | 56.8 | 2230 | 980 | 1050 |
| 3-13 | 0.10 | 0.90 | 0.54 | 0.46 | 0.3 | 1095 | 0.2 | 56.5 | 2980 | 1040 | 990 |
| 3-14 | 0.10 | 0.90 | 0.54 | 0.46 | 0.5 | 1080 | 0.2 | 56.2 | 3200 | 1180 | 950 |
| 3-15 | 0.10 | 0.90 | 0.54 | 0.46 | 1.0 | 105310 | 0.3 | 55.0 | 2750 | 1210 | 1080 |
| 3-16 | 0.10 | 0.90 | 0.54 | 0.46 | 3.0 | 1055 | 0.7 | 53.2 | 2100 | 1100 | 1070 |
| 3-17 | 0.05 | 0.95 | 0.60 | 0.40 | 0 | 850 | 1.4 | 35.1 | 95 | 910 | 1050 |
| 3-18 | 0.05 | 0.95 | 0.60 | 0.40 | 0.05 | 805 | 0.6 | 34.8 | 1880 | 1020 | 1010 |
| 3-19 | 0.05 | 0.95 | 0.60 | 0.40 | 0.1 | 795 | 0.3 | 34.5 | 2630 | 1090 | 980 |
| 3-20 | 0.05 | 0.95 | 0.60 | 0.40 | 0.3 | 788 | 0.2 | 34.0 | 3750 | 1140 | 950 |
| 3-21 | 0.05 | 0.95 | 0.60 | 0.40 | 0.5 | 760 | 0.2 | 33.8 | 4200 | 1230 | 910 |
| 3-22 | 0.05 | 0.95 | 0.60 | 0.40 | 1.0 | 715 | 0.3 | 32.5 | 2690 | 1270 | 1000 |
| 3-23 | 0.05 | 0.95 | 0.60 | 0.40 | 3.0 | 698 | 0.7 | 30.8 | 2200 | 1100 | 1010 |
| 3-24 | 0.05 | 0.95 | 0.49 | 0.51 | 0 | 2490 | 0.8 | 74.1 | 60 | 910 | 1120 |
| 3-25 | 0.05 | 0.95 | 0.49 | 0.51 | 0.05 | 2090 | 0.6 | 73.8 | 1120 | 990 | 1030 |
| 3-26 | 0.05 | 0.95 | 0.49 | 0.51 | 0.1 | 1980 | 0.3 | 72.8 | 1730 | 1060 | 1010 |
| 3-27 | 0.05 | 0.95 | 0.49 | 0.51 | 0.3 | 1710 | 0.2 | 72.8 | 2040 | 1170 | 990 |
| 3-28 | 0.05 | 0.95 | 0.49 | 0.51 | 0.5 | 1624 | 0.2 | 71.6 | 2515 | 1280 | 980 |
| 3-29 | 0.05 | 0.95 | 0.49 | 0.51 | 1.0 | 1422 | 0.3 | 52.3 | 1850 | 1250 | 1060 |
| 3-30 | 0.05 | 0.95 | 0.49 | 0.51 | 3.0 | 1050 | 0.6 | 49.5 | 940 | 1140 | 1080 |
| 3-31 | 0.05 | 0.95 | 0.40 | 0.60 | 0 | 850 | 2.1 | 44.4 | 80 | 890 | 1330 |
| 3-32 | 0.05 | 0.95 | 0.40 | 0.60 | 0.05 | 820 | 0.7 | 44.1 | 1540 | 1010 | 1290 |
| 3-33 | 0.05 | 0.95 | 0.40 | 0.60 | 0.1 | 800 | 0.4 | 43.5 | 2700 | 1130 | 1270 |
| 3-34 | 0.05 | 0.95 | 0.40 | 0.60 | 0.3 | 790 | 0.3 | 43.2 | 3520 | 1190 | 1250 |
| 3-35 | 0.05 | 0.95 | 0.40 | 0.60 | 0.5 | 782 | 0.3 | 42.5 | 3830 | 1250 | 1230 |
| 3-36 | 0.05 | 0.95 | 0.40 | 0.60 | 1.0 | 773 | 0.4 | 42.1 | 2900 | 1270 | 1260 |
| 3-37 | 0.05 | 0.95 | 0.40 | 0.60 | 3.0 | 758 | 0.6 | 40.6 | 2010 | 1130 | 1310 |
| 3-38 | 0.01 | 0.99 | 0.48 | 0.52 | 0 | 1550 | 1.5 | 72.1 | 60 | 990 | 820 |
| 3-39 | 0.01 | 0.99 | 0.48 | 0.52 | 0.05 | 1220 | 0.7 | 70.8 | 1580 | 980 | 830 |
| 3-40 | 0.01 | 0.99 | 0.48 | 0.52 | 0.1 | 1095 | 0.3 | 70.2 | 1930 | 1050 | 820 |
| 3-41 | 0.01 | 0.99 | 0.48 | 0.52 | 0.3 | 1050 | 0.3 | 70.2 | 2090 | 1180 | 810 |
| 3-42 | 0.01 | 0.99 | 0.48 | 0.52 | 0.5 | 1015 | 0.2 | 69.9 | 2660 | 1190 | 810 |
| 3-43 | 0.01 | 0.99 | 0.48 | 0.52 | 1.0 | 996 | 0.3 | 68.7 | 2110 | 1210 | 860 |
| 3-44 | 0.01 | 0.99 | 0.48 | 0.52 | 3.0 | 972 | 0.7 | 65.6 | 1280 | 1090 | 900 |
| 3-45 | 0.01 | 0.99 | 0.30 | 0.70 | 0 | 430 | 1.8 | 27.8 | 250 | 880 | 1640 |
| 3-46 | 0.01 | 0.99 | 0.30 | 0.70 | 0.05 | 405 | 0.7 | 27.0 | 2020 | 990 | 1480 |
| 3-47 | 0.01 | 0.99 | 0.30 | 0.70 | 0.1 | 398 | 0.3 | 26.5 | 2980 | 1060 | 1430 |
| 3-48 | 0.01 | 0.99 | 0.30 | 0.70 | 0.3 | 392 | 0.3 | 26.2 | 4030 | 1170 | 1430 |
| 3-49 | 0.01 | 0.99 | 0.30 | 0.70 | 0.5 | 383 | 0.2 | 25.5 | 4550 | 1210 | 1400 |
| 3-50 | 0.01 | 0.99 | 0.30 | 0.70 | 1.0 | 380 | 0.3 | 24.3 | 3340 | 1230 | 1400 |
| 3-51 | 0.01 | 0.99 | 0.30 | 0.70 | 3.0 | 358 | 0.6 | 23.5 | 2370 | 1100 | 1540 |

NOTE x + (1 − x) = 1 and y + z = 1

EXAMPLE 4

The procedure of the preparation of Example 2 was followed except that $MnO_2$ was added to the basic components. The piezoelectric compositions were prepared and the piezoelectric properties were measured as shown in Table 4. As is clear from Table 4, the addition of $MnO_2$ resulted in substantial improvements in the values of Qm and tan δ. However, when more than 3 wt.% $MnO_2$ was added, the values of Qm and $\epsilon/\epsilon_o$ decreased and the value of tan δ increased. However, the compositions had inferior insulation properties. Accordingly, the optimum quantity of the manganese ($MnO_2$) component was established in the range of 0.01–3.0 wt.% based on the total weight of basic components.

lected. Sample numbers 5-26, 5-27 and 5-28 are conventional $PbTiO_3$ — $PbZrO_3$ piezoelectric ceramic compo- Table 4

| No. | A | x | 1 − x | y | z | $x(A_2Sb_2O_7)_i \cdot (1 − x)\,[y(PbTiO_3 \cdot z(PbZrO_3)]$ $MnO_2$ (Wt%) | $\epsilon/\epsilon_o$ | tan δ (%) | Kp (%) | Qm | flex strength (Kg/cm²) | fr-T.C. (ppm/C) |
|---|---|---|---|---|---|---|---|---|---|---|---|---|
| 4-1 | Sr | 0.05 | 0.95 | 0.48 | 0.52 | 0 | 2890 | 1.9 | 78.0 | 65 | 910 | 1050 |
| 4-2 | Sr | 0.05 | 0.95 | 0.48 | 0.52 | 0.01 | 2655 | 0.9 | 76.8 | 1530 | 990 | 1040 |
| 4-3 | Sr | 0.05 | 0.95 | 0.48 | 0.52 | 0.05 | 2530 | 0.5 | 76.5 | 1700 | 1080 | 1060 |
| 4-4 | Sr | 0.05 | 0.95 | 0.48 | 0.52 | 0.1 | 2380 | 0.3 | 74.8 | 2050 | 1160 | 970 |
| 4-5 | Sr | 0.05 | 0.95 | 0.48 | 0.52 | 0.3 | 1920 | 0.2 | 72.5 | 2500 | 1190 | 940 |
| 4-6 | Sr | 0.05 | 0.95 | 0.48 | 0.52 | 0.5 | 1830 | 0.2 | 70.8 | 2830 | 1255 | 990 |
| 4-7 | Sr | 0.05 | 0.95 | 0.48 | 0.52 | 1.0 | 1520 | 0.3 | 63.2 | 2070 | 1250 | 1000 |
| 4-8 | Sr | 0.05 | 0.95 | 0.48 | 0.52 | 3.0 | 1025 | 0.7 | 59.0 | 1500 | 1190 | 1110 |
| 4-9 | Sr | 0.05 | 0.95 | 0.48 | 0.52 | 4.0 | 698 | 1.7 | 39.5 | 380 | 1110 | 1180 |
| 4-10 | Pb | 0.05 | 0.95 | 0.49 | 0.51 | 0 | 2610 | 2.0 | 76.5 | 60 | 890 | 1080 |
| 4-11 | Pb | 0.05 | 0.95 | 0.49 | 0.51 | 0.05 | 2340 | 0.6 | 75.0 | 1330 | 990 | 1090 |
| 4-12 | Pb | 0.05 | 0.95 | 0.49 | 0.51 | 0.1 | 2010 | 0.4 | 73.7 | 1900 | 1050 | 1030 |
| 4-13 | Pb | 0.05 | 0.95 | 0.49 | 0.51 | 0.3 | 1745 | 0.3 | 72.0 | 2250 | 1170 | 940 |
| 4-14 | Pb | 0.05 | 0.95 | 0.49 | 0.51 | 0.5 | 1650 | 0.2 | 70.5 | 2470 | 1230 | 900 |
| 4-15 | Pb | 0.05 | 0.95 | 0.49 | 0.51 | 1.0 | 1385 | 0.4 | 62.8 | 1880 | 1245 | 920 |
| 4-16 | Pb | 0.05 | 0.95 | 0.49 | 0.51 | 3.0 | 980 | 0.7 | 55.7 | 1350 | 1180 | 910 |
| 4-17 | Ba | 0.01 | 0.99 | 0.48 | 0.52 | 0 | 1680 | 1.8 | 73.5 | 60 | 930 | 1030 |
| 4-18 | Ba | 0.01 | 0.99 | 0.48 | 0.52 | 0.05 | 1510 | 0.5 | 71.2 | 1830 | 1050 | 1010 |
| 4-19 | Ba | 0.01 | 0.99 | 0.48 | 0.52 | 0.1 | 1440 | 0.3 | 70.8 | 2370 | 1130 | 990 |
| 4-20 | Ba | 0.01 | 0.99 | 0.48 | 0.52 | 0.3 | 1320 | 0.3 | 68.6 | 2880 | 1210 | 950 |
| 4-21 | Ba | 0.01 | 0.99 | 0.48 | 0.52 | 0.5 | 1280 | 0.2 | 65.2 | 3030 | 1275 | 890 |
| 4-22 | Ba | 0.01 | 0.99 | 0.48 | 0.52 | 1.0 | 975 | 0.3 | 5.99 | 2460 | 1280 | 930 |
| 4-23 | Ba | 0.01 | 0.99 | 0.48 | 0.52 | 3.0 | 830 | 0.6 | 52.7 | 1450 | 1150 | 1050 |

EXAMPLE 5

High dielectric piezoelectric ceramic compositions of the invention were prepared in accordance with the procedure of Example 1 by using PbO, $TiO_2$, $ZrO_2$, CdO and $Nb_2O_5$ as the starting powdery materials. The electromechanical coupling coefficient Kp and the mechanical quality factor Qm of the composition were measured in accordance with the procedure of Example 1.

The piezoelectric properties of the various compositions produced are shown in Table 5. As is clear from Table 5, high electromechanical transducing coefficients Kp were obtained over a relatively broad range, and the optimum values of Qm, $\epsilon/\epsilon_o$ and tan δ which are necessary for the intended purposes of the composition vary according to the broad range composition sesitions. The properties of the compositions of the invention are substantially superior to those of the conventional compositions.

Table 5

| No. | x | 1 − x | y | z | $\epsilon/\epsilon_o$ | tan δ (%) | Kp (%) | Qm | fr,TC (ppm/C) |
|---|---|---|---|---|---|---|---|---|---|
| 5-1 | 0.20 | 0.8 | 0.80 | 0.20 | 298 | 1.8 | 20.5 | 180 | −165 |
| 5-2 | 0.20 | 0.8 | 0.70 | 0.30 | 415 | 2.0 | 24.7 | 120 | −150 |
| 5-3 | 0.20 | 0.8 | 0.48 | 0.52 | 2360 | 2.1 | 33.4 | 60 | 100 |
| 5-4 | 0.20 | 0.8 | 0.30 | 0.70 | 445 | 1.9 | 22.6 | 110 | −150 |
| 5-5 | 0.20 | 0.8 | 0.20 | 0.80 | 365 | 1.7 | 19.4 | 150 | −160 |
| 5-6 | 0.10 | 0.9 | 0.54 | 0.46 | 1230 | 1.8 | 60.5 | 75 | 10 |
| 5-7 | 0.10 | 0.9 | 0.48 | 0.52 | 2250 | 1.9 | 66.3 | 60 | 60 |
| 5-8 | 0.10 | 0.9 | 0.46 | 0.54 | 1330 | 1.9 | 57.6 | 75 | − 80 |
| 5-9 | 0.08 | 0.92 | 0.50 | 0.50 | 2360 | 2.1 | 68.4 | 60 | 30 |
| 5-10 | 0.08 | 0.92 | 0.48 | 0.52 | 2290 | 2.0 | 66.9 | 65 | 50 |
| 5-11 | 0.05 | 0.95 | 0.80 | 0.20 | 410 | 1.3 | 22.5 | 155 | −120 |
| 5-12 | 0.05 | 0.95 | 0.68 | 0.32 | 465 | 1.6 | 26.8 | 130 | −110 |
| 5-13 | 0.05 | 0.95 | 0.60 | 0.40 | 790 | 1.5 | 37.1 | 100 | − 30 |
| 5-14 | 0.05 | 0.95 | 0.52 | 0.48 | 1805 | 1.6 | 54.8 | 80 | 20 |
| 5-15 | 0.05 | 0.95 | 0.50 | 0.50 | 2195 | 1.8 | 66.3 | 70 | 35 |
| 5-16 | 0.05 | 0.95 | 0.49 | 0.51 | 2380 | 1.9 | 73.0 | 60 | 40 |
| 5-17 | 0.05 | 0.95 | 0.48 | 0.52 | 2410 | 2.0 | 68.8 | 70 | 50 |
| 5-18 | 0.05 | 0.95 | 0.46 | 0.54 | 1380 | 2.2 | 68.6 | 75 | − 70 |
| 5-19 | 0.05 | 0.95 | 0.40 | 0.60 | 810 | 2.3 | 43.8 | 85 | −110 |
| 5-20 | 0.05 | 0.95 | 0.32 | 0.68 | 545 | 1.8 | 32.0 | 180 | −150 |
| 5-21 | 0.01 | 0.99 | 0.80 | 0.20 | 315 | 1.5 | 20.2 | 175 | −145 |
| 5-22 | 0.01 | 0.99 | 0.70 | 0.30 | 368 | 1.4 | 22.5 | 130 | −140 |
| 5-23 | 0.01 | 0.99 | 0.48 | 0.52 | 1480 | 1.6 | 70.9 | 65 | 25 |
| 5-24 | 0.01 | 0.99 | 0.30 | 0.70 | 420 | 1.9 | 27.0 | 240 | − 80 |
| 5-25 | 0.01 | 0.99 | 0.20 | 0.80 | 290 | 2.1 | 21.5 | 280 | −120 |
| 5-26 | 0 | | 0.55 | 0.45 | 340 | | 8.0 | 46 | — |
| 5-27 | 0 | | 0.48 | 0.52 | 1060 | | 44.0 | 240 | — |
| 5-28 | 0 | | 0.30 | 0.70 | 370 | | 27.0 | 370 | — |

NOTE: x + (1 − x) = 1 and y + z = 1

$(x(Cd_2Nb_2O_7)_i (1 − x)\,[y(PbTiO_3)\,z\,(PbZrO_3)]$

EXAMPLE 6

The procedure of the preparation of Example 5 was followed except that the $Cd_2Nb_2O_7$ component was substituted by $Sr_2Nb_2O_7$, $Pb_2Nb_2O_7$ or $Ba_2Nb_2O_7$. The piezoelectric properties of the resulting compositions are shown in Table 6, together with the components and the compositions. When Cd was substituted by Sr, Ba or Pb, the ternary system solid solution ceramics similar to those of Example 1 were obtained. The compositions have high $\epsilon/\epsilon_o$ values which give high piezoelectric d constants. The Kp and $\epsilon$ values which are based on the piezoelectric d constant are shown in Table 6.

Table 6

$x(A_2Nb_2O_7)_1 \cdot (1-x)[y(PbTiO_3) \cdot z(PbTiO_3)]$

| No. | x | 1 − x | y | x | A | $\epsilon/\epsilon_o$ | tan δ (%) | Kp (%) | Qm | fr·TC (ppm/C) |
|---|---|---|---|---|---|---|---|---|---|---|
| 6-1 | 0.20 | 0.8 | 0.8 | 0.2 | Sr | 540 | 1.0 | 20.8 | 210 | −160 |
| 6-2 | 0.20 | 0.8 | 0.50 | 0.50 | Sr | 3150 | 2.1 | 34.8 | 155 | 60 |
| 6-3 | 0.10 | 0.9 | 0.54 | 0.46 | Sr | 1480 | 1.9 | 52.8 | 85 | 20 |
| 6-4 | 0.10 | 0.9 | 0.46 | 0.54 | Sr | 2880 | 1.8 | 61.3 | 70 | − 55 |
| 6-5 | 0.05 | 0.95 | 0.60 | 0.40 | Sr | 850 | 1.4 | 35.8 | 100 | − 40 |
| 6-6 | 0.05 | 0.95 | 0.52 | 0.48 | Sr | 1720 | 1.4 | 56.7 | 75 | 35 |
| 6-7 | 0.05 | 0.95 | 0.40 | 0.60 | Sr | 855 | 2.0 | 45.2 | 100 | −120 |
| 6-8 | 0.01 | 0.99 | 0.52 | 0.48 | Sr | 1268 | 1.5 | 68.2 | 75 | 30 |
| 6-9 | 0.01 | 0.99 | 0.48 | 0.52 | Sr | 415 | 1.6 | 70.9 | 70 | 20 |
| 6-10 | 0.20 | 0.8 | 0.80 | 0.20 | Pb | 505 | 2.0 | 21.8 | 190 | −150 |
| 6-11 | 0.20 | 0.8 | 0.50 | 0.50 | Pb | 2996 | 2.3 | 56.2 | 150 | 50 |
| 6-12 | 0.10 | 0.9 | 0.54 | 0.46 | Pb | 1380 | 2.0 | 57.9 | 80 | 25 |
| 6-13 | 0.10 | 0.9 | 0.46 | 0.54 | Pb | 2810 | 1.8 | 59.8 | 75 | − 60 |
| 6-14 | 0.05 | 0.95 | 0.60 | 0.40 | Pb | 785 | 1.5 | 35.4 | 105 | − 45 |
| 6-15 | 0.05 | 0.95 | 0.52 | 0.48 | Pb | 2270 | 1.9 | 70.5 | 75 | 30 |
| 6-16 | 0.05 | 0.95 | 0.40 | 0.60 | Pb | 805 | 1.6 | 42.9 | 90 | −110 |
| 6-17 | 0.01 | 0.99 | 0.52 | 0.48 | Pb | 1300 | 1.8 | 68.5 | 70 | 25 |
| 6-18 | 0.01 | 0.99 | 0.48 | 0.52 | Pb | 1510 | 2.1 | 70.8 | 70 | 20 |
| 6-19 | 0.20 | 0.8 | 0.80 | 0.20 | Ba | 585 | 1.9 | 22.5 | 220 | −155 |
| 6-20 | 0.20 | 0.8 | 0.50 | 0.50 | Ba | 3180 | 2.2 | 36.8 | 155 | 55 |
| 6-21 | 0.10 | 0.99 | 0.54 | 0.46 | Ba | 1510 | 1.8 | 59.0 | 88 | 30 |
| 6-22 | 0.10 | 0.99 | 0.46 | 0.54 | Ba | 2995 | 2.1 | 62.5 | 73 | − 40 |
| 6-23 | 0.05 | 0.95 | 0.60 | 0.40 | Ba | 885 | 1.6 | 37.0 | 110 | − 40 |
| 6-24 | 0.05 | 0.95 | 0.52 | 0.48 | Ba | 1810 | 1.9 | 60.8 | 75 | 35 |
| 6-25 | 0.05 | 0.95 | 0.40 | 0.60 | Ba | 905 | 2.1 | 46.2 | 85 | −120 |
| 6-26 | 0.01 | 0.99 | 0.52 | 0.48 | BA | 1590 | 1.8 | 71.2 | 75 | 30 |
| 6-27 | 0.01 | 0.99 | 0.48 | 0.52 | Ba | 1515 | 2.0 | 70.5 | 70 | 20 |

NOTE: $x + (1 − x) = 1$ and $y + z = 1$

EXAMPLE 7

The procedure for the preparation of Example 5 was followed except that $MnO_2$ was added to the basic components. The piezoelectric compositions were prepared and the piezoelectric properties were measured as shown in Table 7 wherein the flex strength is shown by the unit, Kg/cm² and the temperature coefficient of the dielectric constant ε is shown by the unit, ppm/° C.

As is clear from Table 7, the values of Qm and tan δ were improved by the addition of $MnO_2$. However, when more than 3 wt.% of $MnO_2$ was added, the values of Qm and $\epsilon/\epsilon_o$ decreased and the values of tan δ decreased. However, the compositions had inferior insulation properties. Accordingly, the optimum quantity of the manganese ($MnO_2$) component was established in the range of 0.01–3 wt.% based on the total weight of the basic components.

Table 7

$x(Cd_2Nb_2O_7)_1(1-x)[y(PbTiO_3) \cdot z(PbZrO_3)]$

| No. | x | 1 − x | y | x | MnO₂ (Wt%) | $\epsilon/\epsilon_o$ | tan δ (%) | Kp (%) | Qm | fr·TC (ppm/C) | flex strength (kg/cm²) |
|---|---|---|---|---|---|---|---|---|---|---|---|
| 7-1 | 0.20 | 0.8 | 0.70 | 0.30 | 0 | 415 | 2.0 | 24.7 | 120 | −150 | 850 |
| 7-2 | 0.20 | 0.8 | 0.70 | 0.30 | 0.01 | 402 | 1.2 | 24.2 | 1050 | −130 | 900 |
| 7-3 | 0.20 | 0.8 | 0.70 | 0.30 | 0.05 | 400 | 1.0 | 24.0 | 2110 | −120 | 960 |
| 7-4 | 0.20 | 0.8 | 0.70 | 0.30 | 0.1 | 395 | 0.5 | 23.8 | 2530 | −105 | 990 |
| 7-5 | 0.20 | 0.8 | 0.70 | 0.30 | 0.3 | 388 | 0.3 | 23.5 | 3090 | − 90 | 1100 |
| 7-6 | 0.20 | 0.8 | 0.70 | 0.30 | 0.5 | 375 | 0.2 | 23.0 | 5250 | − 80 | 1230 |
| 7-7 | 0.20 | 0.8 | 0.70 | 0.30 | 1.0 | 370 | 0.3 | 22.2 | 3870 | − 65 | 1160 |
| 7-8 | 0.20 | 0.8 | 0.70 | 0.30 | 3.0 | 355 | 0.7 | 21.3 | 3030 | − 40 | 1090 |
| 7-9 | 0.20 | 0.8 | 0.70 | 0.30 | 4.0 | 305 | 1.5 | 18.5 | 630 | − 30 | 1060 |
| 7-10 | 0.10 | 0.9 | 0.46 | 0.54 | 0 | 1330 | 1.9 | 57.6 | 75 | − 80 | 900 |
| 7-11 | 0.10 | 0.9 | 0.46 | 0.54 | 0.05 | 1095 | 0.7 | 56.0 | 1690 | − 60 | 960 |
| 7-12 | 0.10 | 0.9 | 0.46 | 0.54 | 0.1 | 1080 | 0.4 | 55.7 | 2270 | − 50 | 990 |
| 7-13 | 0.10 | 0.9 | 0.46 | 0.54 | 0.3 | 1065 | 0.3 | 55.2 | 2650 | − 40 | 1130 |
| 7-14 | 0.10 | 0.9 | 0.46 | 0.54 | 0.5 | 1062 | 0.3 | 54.5 | 3080 | − 35 | 1210 |
| 7-15 | 0.10 | 0.9 | 0.46 | 0.54 | 1.0 | 1020 | 0.3 | 54.0 | 2630 | 10 | 1130 |
| 7-16 | 0.10 | 0.9 | 0.46 | 0.54 | 3.0 | 1000 | 0.8 | 51.5 | 2000 | 30 | 1100 |
| 7-17 | 0.08 | 0.92 | 0.50 | 0.50 | 0 | 2360 | 2.1 | 68.4 | 60 | 30 | 930 |
| 7-18 | 0.08 | 0.92 | 0.50 | 0.50 | 0.05 | 2050 | 0.9 | 66.8 | 1770 | 40 | 980 |
| 7-19 | 0.08 | 0.92 | 0.50 | 0.50 | 0.1 | 1990 | 0.4 | 65.9 | 2230 | 55 | 1060 |
| 7-20 | 0.08 | 0.92 | 0.50 | 0.50 | 0.3 | 1830 | 0.3 | 65.2 | 2370 | 60 | 1230 |
| 7-21 | 0.08 | 0.92 | 0.50 | 0.50 | 0.5 | 1800 | 0.2 | 64.7 | 2550 | 70 | 1290 |
| 7-22 | 0.08 | 0.92 | 0.50 | 0.50 | 1.0 | 1795 | 0.3 | 64.5 | 2190 | 90 | 1200 |
| 7-23 | 0.08 | 0.92 | 0.50 | 0.50 | 3.0 | 1638 | 0.7 | 60.8 | 1800 | 110 | 1080 |
| 7-24 | 0.05 | 0.95 | 0.49 | 0.51 | 0 | 2380 | 1.9 | 73.0 | 60 | 40 | 930 |
| 7-25 | 0.05 | 0.95 | 0.49 | 0.51 | 0.3 | 1520 | 0.2 | 69.8 | 2200 | 55 | 1010 |
| 7-26 | 0.05 | 0.95 | 0.49 | 0.51 | 0.5 | 1390 | 0.2 | 68.5 | 2630 | 60 | 1180 |
| 7-27 | 0.05 | 0.95 | 0.49 | 0.51 | 1.0 | 1085 | 0.4 | 51.3 | 1985 | 75 | 1250 |
| 7-28 | 0.05 | 0.95 | 0.49 | 0.51 | 3.0 | 950 | 0.7 | 49.0 | 1010 | 100 | 1130 |
| 7-29 | 0.05 | 0.95 | 0.40 | 0.60 | 0 | 810 | 2.3 | 43.8 | 85 | −110 | 970 |
| 7-30 | 0.05 | 0.95 | 0.40 | 0.60 | 0.05 | 790 | 1.0 | 43.0 | 1980 | − 95 | 1070 |
| 7-31 | 0.05 | 0.95 | 0.40 | 0.60 | 0.1 | 788 | 0.5 | 42.5 | 2330 | − 80 | 1150 |
| 7-32 | 0.05 | 0.95 | 0.40 | 0.60 | 0.3 | 775 | 0.3 | 42.2 | 2680 | − 60 | 1230 |
| 7-33 | 0.05 | 0.95 | 0.40 | 0.60 | 0.5 | 762 | 0.3 | 41.5 | 3520 | − 40 | 1280 |
| 7-34 | 0.05 | 0.95 | 0.40 | 0.60 | 1.0 | 75.0 | 0.3 | 41.0 | 2790 | − 25 | 1210 |
| 7-35 | 0.05 | 0.95 | 0.40 | 0.60 | 3.0 | 708 | 0.9 | 39.7 | 1980 | − 10 | 1130 |
| 7-36 | 0.01 | 0.99 | 0.70 | 0.30 | 0 | 368 | 1.4 | 22.5 | 130 | −140 | 960 |
| 7-37 | 0.01 | 0.99 | 0.70 | 0.30 | 0.05 | 355 | 0.6 | 22.0 | 1990 | −130 | 990 |
| 7-38 | 0.01 | 0.99 | 0.70 | 0.30 | 0.1 | 350 | 0.3 | 21.8 | 2340 | −115 | 1080 |
| 7-39 | 0.01 | 0.99 | 0.70 | 0.30 | 0.3 | 348 | 0.2 | 21.7 | 2880 | −100 | 1210 |
| 7-40 | 0.01 | 0.99 | 0.70 | 0.30 | 0.5 | 343 | 0.2 | 21.6 | 4270 | − 85 | 1320 |
| 7-41 | 0.01 | 0.99 | 0.70 | 0.30 | 1.0 | 340 | 0.3 | 21.0 | 3110 | − 60 | 1230 |
| 7-42 | 0.01 | 0.99 | 0.70 | 0.30 | 3.0 | 325 | 0.6 | 20.2 | 2050 | − 40 | 1190 |

Table 7-continued

| No. | x | 1 − x | y | x (Cd$_2$Nb$_2$O$_7$)$_i$ (1 − x) [y (PbTiO$_3$) z (PbZrO$_3$)] MnO$_2$ (Wt%) | ε/ε$_o$ | tan δ (%) | Kp (%) | Qm | fr · TC (ppm/C) | flex strength (kg/cm$^2$) |
|---|---|---|---|---|---|---|---|---|---|---|
| 7-43 | 0.01 | 0.99 | 0.48 | 0.52 0 | 1480 | 1.6 | 70.9 | 65 | 25 | 990 |
| 7-44 | 0.01 | 0.99 | 0.48 | 0.52 0.05 | 1230 | 1.0 | 69.5 | 1670 | 30 | 1100 |
| 7-45 | 0.01 | 0.99 | 0.48 | 0.52 0.1 | 1225 | 0.4 | 69.2 | 1830 | 50 | 1230 |
| 7-46 | 0.01 | 0.99 | 0.48 | 0.52 0.3 | 1223 | 0.3 | 68.5 | 2130 | 15 | 1280 |
| 7-47 | 0.01 | 0.99 | 0.48 | 0.52 0.5 | 1205 | 0.2 | 68.5 | 2580 | 80 | 1310 |
| 7-48 | 0.01 | 0.99 | 0.48 | 0.52 1.0 | 1196 | 0.3 | 67.3 | 2100 | 90 | 1220 |
| 7-49 | 0.01 | 0.99 | 0.48 | 0.52 3.0 | 1135 | 0.7 | 64.2 | 1390 | 120 | 1190 |

NOTE: x + (1 − x) = 1 and y + z = 1

EXAMPLE 8

The procedure of the preparation of Example 6 was followed except that MnO$_2$ was added to the basic components. The piezoelectric compositions were prepared and the piezoelectric properties were measured as shown in Table 8. As is clear from Table 8, the values of Qm and tan δ were improved by adding MnO$_2$. However, when more than 3 wt.% MnO$_2$ was added to the composition, the values of Qm and ε/ε$_o$ decreased and the values of tan δ increased. However, the compositions had inferior insulation properties. Accordingly, the optimum quantity of the manganese (MnO$_2$) component is in the range of 0.01–3.0 wt.% based on the total weight of the basic components.

TABLE 8

| No. | x | 1 − x | y | z | MnO$_2$ A | (kg/ wt.%) | flex strength cm$^2$ | ε/ε | tan δ % | Kp % | Qm | fr · TC (ppm/° C) |
|---|---|---|---|---|---|---|---|---|---|---|---|---|
| 8-1 | 0.05 | 0.95 | 0.48 | 0.52 | Sr | 0. | 930 | 2320 | 1.8 | 69.7 | 75 | 20 |
| 8-2 | 0.05 | 0.95 | 0.48 | 0.52 | Sr | 0.01 | 990 | 2095 | 0.7 | 69.2 | 1830 | 25 |
| 8-3 | 0.05 | 0.95 | 0.48 | 0.52 | Sr | 0.05 | 1090 | 2530 | 0.5 | 76.5 | 1700 | 35 |
| 8-4 | 0.05 | 0.95 | 0.48 | 0.52 | Sr | 0.1 | 1210 | 2380 | 0.3 | 74.8 | 2050 | 50 |
| 8-5 | 0.05 | 0.95 | 0.48 | 0.52 | Sr | 0.3 | 1290 | 1490 | 0.3 | 68.0 | 2550 | 60 |
| 8-6 | 0.05 | 0.95 | 0.48 | 0.52 | Sr | 0.5 | 1310 | 1320 | 0.2 | 66.8 | 2630 | 75 |
| 8-7 | 0.05 | 0.95 | 0.48 | 0.52 | Sr | 1.0 | 1230 | 1065 | 0.4 | 61.5 | 2050 | 90 |
| 8-8 | 0.05 | 0.95 | 0.48 | 0.52 | Sr | 3.0 | 1180 | 899 | 0.8 | 59.8 | 1320 | 110 |
| 8-9 | 0.05 | 0.95 | 0.48 | 0.52 | Sr | 4.0 | 1150 | 530 | 1.6 | 35.5 | 340 | 150 |
| 8-10 | 0.05 | 0.95 | 0.49 | 0.51 | Pb | 0 | 900 | 1970 | 1.9 | 70.5 | 75 | 50 |
| 8-11 | 0.05 | 0.95 | 0.49 | 0.51 | Pb | 0.05 | 950 | 2340 | 0.6 | 75.0 | 1330 | 60 |
| 8-12 | 0.05 | 0.95 | 0.49 | 0.51 | Pb | 0.1 | 990 | 2010 | 0.4 | 73.7 | 1900 | 75 |
| 8-13 | 0.05 | 0.95 | 0.49 | 0.51 | Pb | 0.3 | 1180 | 1445 | 0.3 | 69.2 | 2380 | 85 |
| 8-14 | 0.05 | 0.95 | 0.49 | 0.51 | Pb | 0.5 | 1260 | 1398 | 0.2 | 67.7 | 2530 | 100 |
| 8-15 | 0.05 | 0.95 | 0.49 | 0.51 | Pb | 1.0 | 1210 | 1090 | 0.5 | 61.5 | 1780 | 120 |
| 8-16 | 0.05 | 0.95 | 0.49 | 0.51 | Pb | 3.0 | 1130 | 870 | 0.8 | 54.8 | 1040 | 140 |
| 8-17 | 0.01 | 0.99 | 0.48 | 0.52 | Ba | 0 | 930 | 1515 | 1.9 | 70.5 | 70 | 20 |
| 8-18 | 0.01 | 0.99 | 0.48 | 0.52 | BA | 0.05 | 1030 | 1510 | 0.5 | 71.2 | 1830 | 30 |
| 8-19 | 0.01 | 0.99 | 0.48 | 0.52 | Ba | 0.1 | 1150 | 1440 | 0.3 | 70.8 | 2370 | 45 |
| 8-20 | 0.01 | 0.99 | 0.48 | 0.52 | Ba | 0.3 | 1230 | 1290 | 0.3 | 68.8 | 2900 | 55 |
| 8-21 | 0.01 | 0.99 | 0.48 | 0.52 | BA | 0.5 | 1290 | 1215 | 0.2 | 66.2 | 3100 | 70 |
| 8-22 | 0.1 | 0.99 | 0.48 | 0.52 | BA | 1.0 | 1230 | 1080 | 0.4 | 59.3 | 2240 | 90 |
| 8-23 | 0.01 | 0.99 | 0.48 | 0.52 | Ba | 3.0 | 1170 | 910 | 0.7 | 53.8 | 1550 | 115 |

$(A_2Nb_2O_7)_{\frac{1}{4}} \cdot (1 - x)[y(PbTiO_3) \cdot z(PbZrO_3)]$ The field dependencies of ε/ε$_o$ and tan δ to the terminal voltage (V) of sample number 4-16 in Table 4 was measured as shown in FIGS. 2 and 3, respectively. As reference compositions, conventional piezoelectric compositions are also shown in FIGS. 2 and 3. When the conventional piezoelectric composition was used under the application of a high voltage, inferior piezoelectric properties resulted because of the increase in tan δ values and the elevation of the temperature.

The samples of the invention show low AC field dependency on ε/ε$_o$ and tan δ. These phenomena reveal that the stable compositions of the invention exhibit low heating values when used as high power ultrasonic transducers in order to very efficiently convert input power to ultrasonic wave energy. The piezoelectric ceramic compositions of the invention are very effective in applications where high amplitude characteristics are required.

Having now fully described this invention, it will be apparent to one of ordinary skill in the art that many changes and modifications can be made thereto without departing from the spirit or scope of the invention set forth herein.

What is claimed as new and intended to be covered by Letters Patent is:

1. A method for preparing a piezoelectric ceramic composition of the formula x (Pyrochlore composite oxide)$_{\frac{1}{4}}$ · (1−x) [y(PbTiO$_3$)z(PbZrO$_3$)]

wherein said pyrochlore composite oxide is selected from the group consisting of Cd$_2$Sb$_2$O$_7$, Cd$_2$Nb$_2$O$_7$, Pb$_2$Sb$_2$O$_7$, Pb$_2$Nb$_2$O$_7$, Sr$_2$Sb$_2$O$_7$, Sr$_2$Nb$_2$O$_7$, Ba$_2$Sb$_2$O$_7$ and Ba$_2$Nb$_2$O$_7$; 0.2 ≤ y ≤ 0.8; 0.2 ≤ z ≤ 0.8; y+z = 1.0 and 0.001 ≤ x ≤ 0.2, and containing 0.01 to 3.0 wt% Mn as MnO$_2$ comprising:

individually forming lead titanate, lead zirconate and pyrochlore composite oxide components;

mixing said components with MnO$_2$ in an amount equivalent to 0.01 to 3.0 wt% Mn to provide a mixture in which said lead titanate, lead zirconate and pyrochlore composite oxide are present in amounts that satisfy said formula; and sintering said mixture at a temperature greater than 1000° C to form said piezoelectric composition.

2. The process of claim 1, which further comprises: calcining said mixed components prior to the sintering of said mixture.

* * * * *

UNITED STATES PATENT AND TRADEMARK OFFICE
CERTIFICATE OF CORRECTION

PATENT NO. : 4,087,366
DATED : May 2, 1978
INVENTOR(S) : YOICHI TANAKA, ET AL

It is certified that error appears in the above-identified patent and that said Letters Patent are hereby corrected as shown below:

Figure 2, ordinate of graph, delete "$\Sigma v/\Sigma$" and insert --$\varepsilon_v/\varepsilon$--

Figure 4, abscissa of graph, after "Terminal Voltage" insert --(V)--

Figure 5:
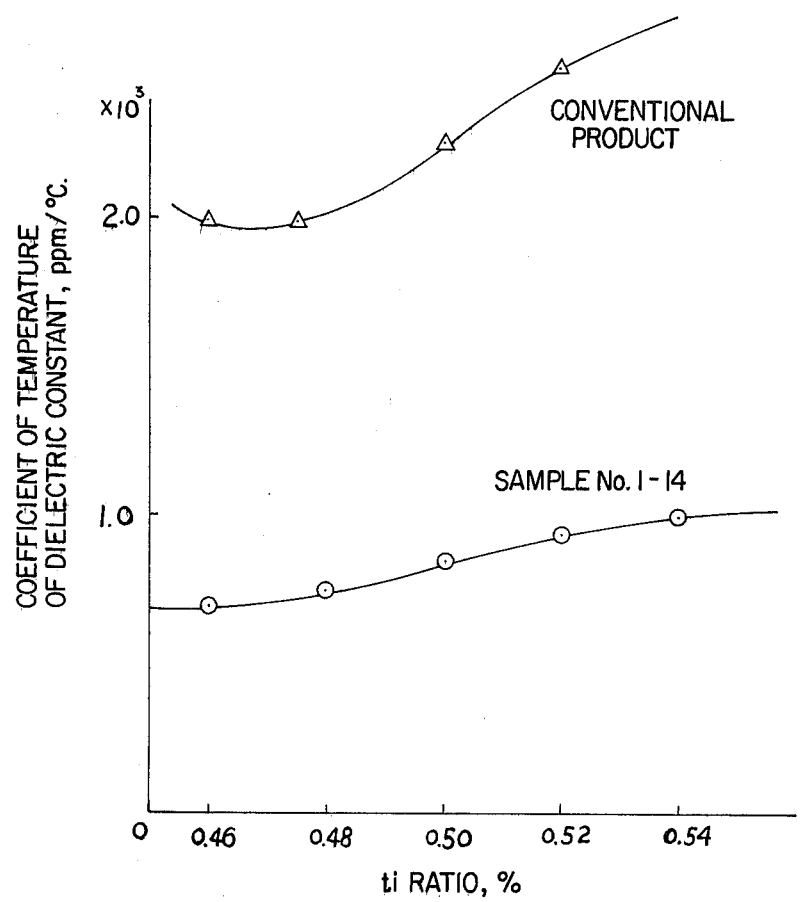
FIG. 5 is a graph showing the relationship of the coefficient of temperature of the dielectric constant to the Ti ratio.

Figure 5, abscissa of graph, delete "ti" and insert --Ti--

Column 1, line 13, delete "zirconatetitanate" and insert --zirconate-titanate--

Column 1, line 19, in the formula, delete "NbHd2/3)$O_3$" and insert --$Nb_{2/3})O_3$--

Column 2, line 35, delete "$\varepsilon_V/\varepsilon$" and insert --$\varepsilon_v/\varepsilon$--

Column 6, Table 1, in the formula, delete "z)$PbZrO_3$)]" and insert --z($PbZrO_3$)]--

Column 6, Table 1, column 7, delete "tan$\Delta$" and insert --tan$\delta$--

United States Patent and Trademark Office
CERTIFICATE OF CORRECTION

PATENT NO. : 4,087,366
DATED : May 2, 1978
INVENTOR(S) : YOICHI TANAKA ET AL

It is certified that error appears in the above-identified patent and that said Letters Patent are hereby corrected as shown below:

Column 6, Table 1, column 10, delete "frT.C." and insert -- $\varepsilon$ T.C. --; in same column, delete "C)" and insert -- °C) --

Column 6, Table 2, column 8, delete "tan∆" and insert -- tan$\delta$ --

Column 6, Table 2, column 11, delete "fr-T.C." and insert -- $\varepsilon$-T.C. --; in the same column, delete "(ppm/C)" and insert -- (ppm/°C) --

Column 7-8, Table 2, column 8, delete "tan∆" and insert -- tan$\delta$ --

Column 7-8, table 2, column 11, delete "fr-T.C." and insert -- $\varepsilon$-T.C. --; in the same column, delete "(ppm/C)" and insert -- (ppm/°C) --

Column 8, Table 3, column 10, delete "Qn" and insert -- Qm --

Column 8, Table 3, column 12, delete "fr-"

UNITED STATES PATENT AND TRADEMARK OFFICE
CERTIFICATE OF CORRECTION

PATENT NO. : 4,087,366

DATED : May 2, 1978

INVENTOR(S) : YOICHI TANAKA, ET AL

It is certified that error appears in the above-identified patent and that said Letters Patent are hereby corrected as shown below:

Col.8, Table 3, col.12, delete "(ppm/C)" and insert --(ppm/°C)--

Column 10, Table 4, column 13, delete "fr-" and insert --$\varepsilon$-- ; same column, delete "(ppm/C)" and insert --(ppm/°C)--

Col.10, Table 5, col. 6, delete "/₀" and insert --$\varepsilon/\varepsilon_0$--

Col. 11, Example 7, line 34, delete "dielectric constant" and insert -- resonant frequency fr --

Col. 12, Table 7, column 8, delete "tar" and insert -- tan --

Col. 13, Table 7, column 8, delete "tar" and insert -- tan --

Col. 13, Table 8, delete title as is and insert -- $(A_2Nb_2O_7)_{1/2} \cdot (1-x)[y(PbTiO_3) \cdot z(PbZrO_3)]$ --

Col. 13, Table 8, column 6, delete "$MnO_2$"

UNITED STATES PATENT AND TRADEMARK OFFICE
CERTIFICATE OF CORRECTION

PATENT NO. : 4,087,366
DATED : May 2, 1978
INVENTOR(S) : YOICHI TANAKA, ET AL

It is certified that error appears in the above-identified patent and that said Letters Patent are hereby corrected as shown below:

Col. 13, Table 8, column 7, delete "(kg/" and insert -- $MnO_2$ --

Col. 13, Table 8, column 8, before "$cm^2$" insert -- (kg/ --; same column, after "$cm^2$" insert -- ) --

Column 13, Table 8, column 9, delete "tan δ"

Column 13, Table 8, column 10, delete "Kp" and insert -- tan δ --

Column 13, Table 8, column 11, before "%" insert -- Kp --

Column 13, Table 8, column 12, delete "fr. TC"

Column 13, Table 8, column 13, before "ppm/°C" and insert -- fr.-T.C.--

Signed and Sealed this

*Twenty-fourth* Day of *July 1979*

[SEAL]

Attest:

LUTRELLE F. PARKER
*Attesting Officer*   *Acting Commissioner of Patents and Trademarks*